United States Patent
Cleaver et al.

(10) Patent No.: US 6,191,388 B1
(45) Date of Patent: Feb. 20, 2001

(54) THERMAL PROCESSOR AND COMPONENTS THEREOF

(75) Inventors: Mark P. Cleaver, Cowiche, WA (US); Gregory J. Wilson; Paul R. McHugh, both of Kalispell, MT (US); Larry J. Funk, Whitefish, MT (US)

(73) Assignee: Semitool, Inc., Kalispell, MT (US)

( * ) Notice: Under 35 U.S.C. 154(b), the term of this patent shall be extended for 0 days.

(21) Appl. No.: 09/195,327

(22) Filed: Nov. 18, 1998

(51) Int. Cl.⁷ ..................................................... F27B 5/14
(52) U.S. Cl. .................... 219/390; 219/405; 118/724; 427/559
(58) Field of Search ..................................... 392/416, 418; 219/405, 411, 390; 118/50.1, 724, 725, 715; 373/136; 427/559, 557, 553; 432/83, 77, 152; 438/795

(56) References Cited

U.S. PATENT DOCUMENTS

| | | | |
|---|---|---|---|
| 4,232,063 | 11/1980 | Rosler et al. | 427/94 |
| 4,533,410 | 8/1985 | Ogura et al. | 148/175 |
| 4,579,080 | 4/1986 | Martin et al. | 118/500 |
| 4,632,058 | 12/1986 | Dixon et al. | 118/725 |
| 4,957,781 | 9/1990 | Kanegae et al. | 427/255.3 |
| 5,001,327 | 3/1991 | Hirasawa et al. | 219/390 |
| 5,146,869 | 9/1992 | Bohannon et al. | 118/724 |
| 5,225,378 | * 7/1993 | Ushikawa | 437/233 |
| 5,567,152 | * 10/1996 | Morimoto | 432/241 |
| 5,749,723 | * 5/1998 | Okase | 432/241 |
| 5,777,300 | * 7/1998 | Homma et al. | 219/679 |
| 5,947,718 | * 9/1999 | Weaver | 432/77 |
| 5,948,300 | * 9/1999 | Gero et al. | 219/390 |

* cited by examiner

Primary Examiner—Teresa Walberg
Assistant Examiner—Showntina Fuqua
(74) Attorney, Agent, or Firm—Lyon & Lyon LLP

(57) ABSTRACT

An injector system for a vertical furnace which has a pedestal and a semiconductor article support within a process container. The injector system includes an injector which is an elongate tube extending into the process chamber. The tube includes a circuitous section in the area of the pedestal to increase residence time for the contents of the tube prior to introduction to the semiconductor articles. A substantially direct section leads from the circuitous section to a discharge end located above the semiconductor article support. The injector system further includes a vertical column heater arranged with the vapor outlet at the upper end of the heater connected via a coupling to the injector in an arrangement to reduce thermal loss.

15 Claims, 3 Drawing Sheets

THERMAL PROCESSOR AND COMPONENTS THEREOF

BACKGROUND OF THE INVENTION

The field of the present invention is thermal processors for semiconductor articles.

Furnaces are used in the processing of semiconductor articles such as wafers. Chemical deposition, etching and the like are conducted in such furnaces through the injection of reactants into a process chamber within which the semiconductor articles are positioned.

Heating of reactants prior to introduction into the process chamber is frequently used to convert the reactant into a gaseous or vapor state, heat the reactant to near the interior temperature of the furnace, and/or chemically transform a precursor into an appropriate reactant for the process. The application of these reactants typically is advantaged by a continuous flow into the furnace during operation. Consequently, a steady state flow is advantageously achieved and one which provides sufficient residence time before entry into the process chamber for complete reactions, thermal equilibration with the interior of the furnace and the like.

Devices have been developed to increase residence time within an injector prior to introduction of the reactants into the furnace process chamber. Long and circuitous paths and paths of greater cross sectional area have been proposed for extended residence time. However, the presence of the cooler materials and the presence of the injectors themselves can have a deleterious effect on the uniformity of the thermal environment in the process chamber.

The reactants may be preconditioned outside of the process chamber. In such circumstances, column heaters may be employed to mix gas, reactant(s) and heat before introduction into the furnace itself. Such column heaters have been thought most efficient when flow is from top to bottom. However, thermal isolation from the furnace itself can create difficulties where an extended path is required from the bottom of the column heater to the heated environment of the process chamber.

SUMMARY OF THE INVENTION

The present invention is directed to the heating of reactants for employment in a vertical furnace for processing of semiconductor articles.

In a first, separate aspect of the present invention, an injector includes an elongate tube which has a discharge end above the semiconductor article support within the furnace. A circuitous section is arranged within the process chamber for increased residence time. This circuitous section is located below the semiconductor article support to avoid interference with the thermal environment surrounding the semiconductor articles. A substantially direct section may then extend adjacent to the support between the circuitous section and the discharge end.

In a second separate aspect of the present invention, a vertical column heater is arranged to flow in reverse order with the vapor outlet located at the top of the column adjacent to the bottom, entry point of the process chamber for the vertical furnace. Greater thermal efficiency has been experienced with less impact upon the reactant(s) in transitioning from the heater to the process chamber.

In a third separate aspect of the present invention, either of the foregoing aspects is contemplated to be employed with a double lift vertical furnace.

In a fourth separate aspect of the present invention, the combination of any of the foregoing separate aspects is contemplated.

Accordingly, it is an object of the present invention to provide an improved system for the introduction of reactant materials to a vertical furnace for the processing of semiconductor articles. Other and further objects and advantages will appear hereinafter.

DETAILED DESCRIPTION OF THE PREFERRED EMBODIMENT

Figure 1:
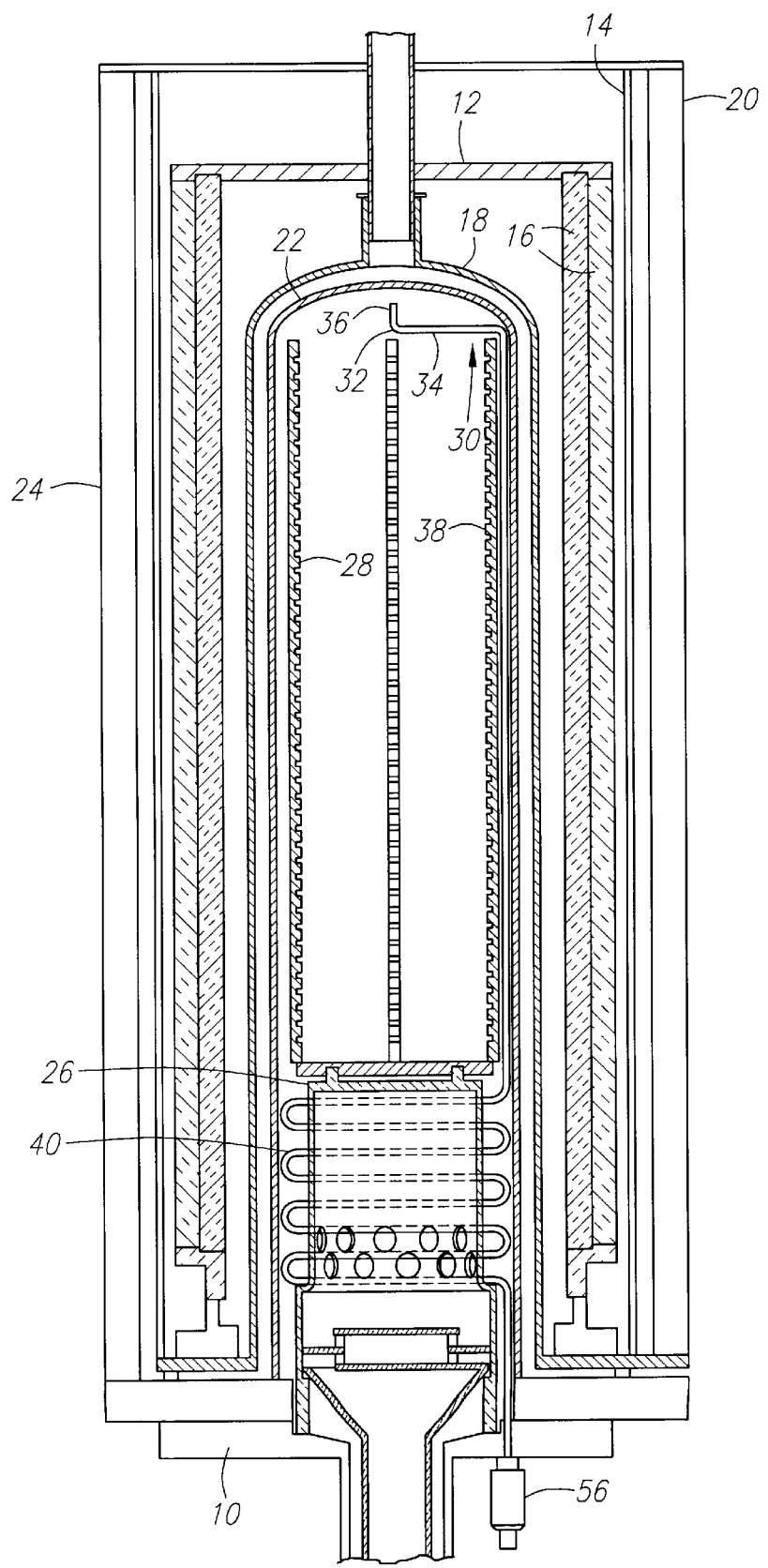
FIG. 1 is a cross-sectional elevation of a double lift vertical furnace.

Turning in detail to the Figures, a vertical double lift furnace is illustrated. A disclosure of one such furnace is fully set forth in U.S. patent application Ser. No. 08/814,723, filed Mar. 7, 1997, the disclosure of which is incorporated herein by reference. The furnace includes a base 10 which is supported on a housing structure (not shown). The housing structure supports from above a furnace heating element assembly 12 including an outer canister 14 within which resistance heating elements 16 are arranged in a cylindrical configuration. Associated with the furnace heating element assembly 12 is a heater liner 18. The heater liner 18 moves with the outer canister 14 and resistance heating elements 16. The heater liner 18 is a cylindrical jar structure preferably of quartz. The entire furnace heating element assembly 12 from the outer canister 14 inwardly to the heater liner 18 is supported by furnace heating element assembly actuators 20 which may be pneumatic cylinders capable of raising and lowering the assembly 12 relative to the base 10.

A process container 22 is concentrically arranged inwardly of the heater liner 18. The process container 22 is also suspended by actuators 24. The process container 22 can be brought down on the base 10 to define a process chamber. Alternately, the process container 22 can be raised to expose the contents of the process chamber. Outwardly of the process container 22, the furnace heating element assembly 12 may independently be raised and lowered to alternately provide access and furnace capabilities.

Within the process chamber, a pedestal 26 is positioned on the base 10. The pedestal 26 is, by being within the process container 22 and above the base 10, in the process chamber. Even so, the area within which the pedestal 26 is located may be subjected to less uniform thermal conditions than higher up within the process chamber.

A semiconductor article support 28 is located atop the pedestal 26. The semiconductor article support 28, when employed to support wafers, provides support about the very edge of each wafer. The wafers are stacked horizontally and frequently are supported by only three points. With the exception of the three points, the wafers are openly exposed to the environment of the process chamber. The three points are arranged such that an end effector can place and remove wafers from the separated stack of wafers. The semiconductor article support 28 may be nothing more than three columns with slots cut on the surfaces facing the center of the horizontal curved arc defined by the three columns. The semiconductor article support 28 may be integral with the pedestal 26 or of separate components. The distinction between the two elements is principally defined by whether or not semiconductor articles are positioned therein.

An injector system is employed with the vertical double lift furnace to introduce processing reactant(s) into the process chamber. This system includes an injector which is an elongate tube 30. Although this tube 30 is most conveniently of continuous tubing material, it may be thought of in three distinct sections. A discharge end 32 is shown to include a radially inwardly extending tube section 34 terminating in a vertical outlet 36 located centrally above the semiconductor article support 28. Reactant(s) flows from the vertical outlet 36 and uniformly down about and between the support positions on the semiconductor article support 28. With semiconductor articles in the form of wafers positioned in the semiconductor article support 28, both sides of the wafer are processed with the possible exception of the points of contact with the semiconductor article support 28. A substantially direct section 38 of the elongate tube 30 extends upwardly from the area of the pedestal 26 to the discharge end 32. This section 38 is intended to provide as little disruption as possible within the area of the process chamber where the semiconductor articles are being processed. It is also preferable that the reactant(s) be substantially heated at this point so that a thermally cool column is not present within the chamber.

A circuitous section 40 of the elongate tube 30 is positioned in the area of the pedestal 26. The circuitous nature of this section 40 may take on any number of specific configurations. A simple back-and-forth arrangement is illustrated where the section 40 lies outwardly of the pedestal 26 and is arranged in arcs lying in a horizontal plane connected by vertical semicircular portions. The principle employed is to increase residence time of the reactant(s) within the injector tube 30 for thermal equilibration, precursor reactions, and/or appropriate vaporization or gasification. The amount of such circuitous tubing within the section 40 is highly process dependent. The flow rate, the tube cross-sectional flow area, the ability to reach a desired temperature, the time required for precursor reactions, initial entry temperature and the like all impact on the tube length in this section.

Figure 2:
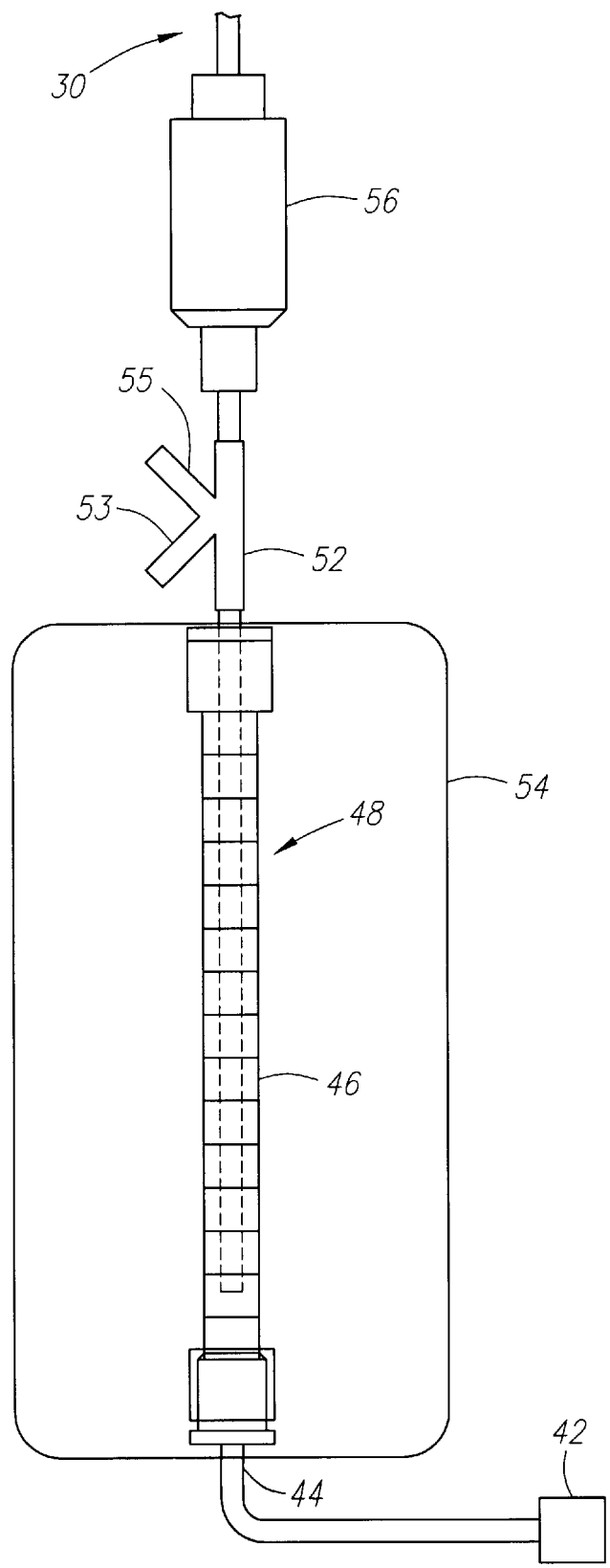
FIG. 2 is a cross-sectional elevation of a vertical column heater.

A number of arrangements may be employed to introduce the reactant(s) into the injector within the process chamber in the first place. As the material is often presented as a liquid, vaporization or gasification before introduction through a vaporization heater is advantageous. Any number of reactants in liquid or mixed form may be desirable for injection into the process chamber. One common reactant is tetraethoxy silane (TEOS). Another is dichloroethane (DCE). A source of reactant 42 is shown to be presented at a reactant inlet 44 at the bottom of a closed column 46 of a vertical column heater, generally designated 48 in FIG. 2. A vapor outlet 52 is arranged at the top. Flow through the closed column proceeds from the bottom upwardly. A heater 54 is arranged to heat the closed column 46 to vaporize or gasify the reactant(s) and to initiate precursor reactions where appropriate. The vertical column heater 48 is appropriately used with TEOS. With DCE, such a heater may be used or the device replaced with a heated ampule with the vaporized material passed through an $H_2O$ pyrolysis torch.

Figure 3:
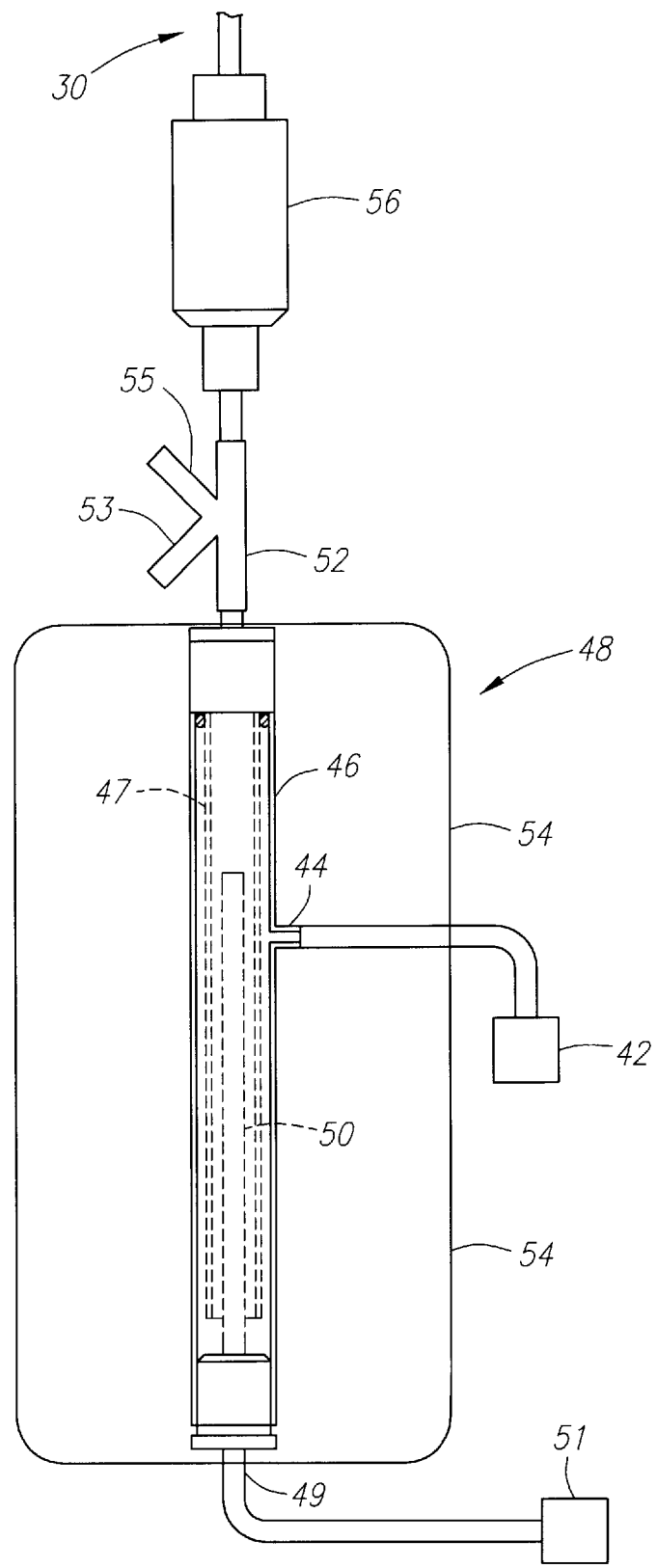
FIG. 3 is a cross-sectional elevation of a second vertical column heater.

Another vertical column heater 48 for vaporizing liquid is shown in FIG. 3 and includes an outside cylindrical column 46 and a concentrically arranged inner cylindrical column 47. The inner column 47 may be sealed to the outer column 46 at one end. The outer column 46 has an inlet 49 at one end and an outlet 52 at the other. The outlet 52 is at the top. The inlet 49 may supply carrier gas injected into the inner column 47 through a thin tube 50 and/or may supply a reactant from a source 51. A liquid reactant may separately or exclusively be injected through a reactant inlet 44 in the wall of the outer column 46 from a source of reactant 42 to be first heated in the annulus between the inner and outer columns 47 and 46. In this instance, heating of the vaporized liquid occurs in both the outer column 46 and in the inner column 47 and proceeds to the outlet 52 at the top of the vaporizer unit. Again, a heater 54 is arranged around the columns for providing the thermal input for vaporization. If a thin tube is used to supply carrier gas, the gas is mixed and heated with the reactant within the inner tube 47 before exiting the vertical column heater 48.

In either embodiment, a coupling 56 is arranged between the vertical column heater 48 and the injector 30. The coupling may be as simple as a temperature resistant tube. The advantage of having the vertical up-flow column with the vapor outlet 52 on top is that the amount of thermal loss which occurs at the coupling 56 before entering the bottom of the reaction chamber is minimal. The passage from the outlet 52 through the coupling 56 may include an inert carrier gas inlet 53 arranged at the top of the closed column 46. The inert carrier gas is typically nitrogen. A startup port 55 may be controlled to vent vaporized reactants until a steady state is achieved. Once achieved, flow is directed through the coupling 56 into the process chamber.

In operation, the source of reactants 42 is caused to inject material into the vertical column heater 48. The heated reactant is expands to flow from the vapor outlet 52. At first, before steady state, the vapor flow may be directed through the vent 55. Once an appropriate flow rate is established, it is directed through the coupling 56 and into the elongate tube 30 of the injector. An inert gas, such as $N_2$, or a chosen reactive gas is introduced through the gas inlet 53. The injected material then is exposed to the heated environment of the furnace within the circuitous section 40. Once passing through the circuitous section, the injected material proceeds through the substantially direct section 38 to the discharge end 32 where it is distributed in the right condition for controlled reaction with the semiconductor articles.

Thus, a system for the controlled injection of reactant(s) in a process chamber of a vertical double lift furnace is disclosed. While embodiments and applications of this invention have been shown and described, it would be apparent to those skilled in the art that many more modifications are possible without departing from the inventive concepts herein. The invention, therefore is not to be restricted except in the spirit of the appended claims.

What is claimed is:

1. An injector for a vertical furnace having a pedestal, a process container and a semiconductor article support, the semiconductor article support being on the pedestal, the process container including a process chamber therein, the process chamber being positionable to enclose the semiconductor article support and the pedestal, the injector comprising an elongate tube extending into the process chamber from below and including a discharge end above the semiconductor article support, a circuitous section below the semiconductor article support and a substantially direct section between the circuitous section and the discharge end adjacent the semiconductor article support.

2. The injector of claim 1, the circuitous section including jogs back and forth to accommodate additional tube length within the process chamber.

3. The injector of claim 1, the discharge end extending from the substantially direct section to a central position above the semiconductor article support.

4. The injector of claim 1 further comprising a vaporizing heater including a vapor outlet;

a coupling between the vapor outlet and the bottom of the process chamber, the vapor outlet being adjacent the bottom of the process chamber.

5. The injector of claim 4 further comprising a source of TEOS coupled with the vaporizing heater.

6. The injector of claim 4 further comprising a source of DCE coupled with the vaporizing heater.

7. The injector of claim 1 further comprising a vertical column heater including a closed column, a heater about the closed column, a reactant inlet at the bottom of the closed column, a vapor outlet at the top of the closed column in communication with the elongate tube.

8. The injector of claim 7 further comprising a coupling between the vapor outlet and the bottom of the process chamber, the vapor outlet from the closed column being adjacent the bottom of the process chamber.

9. An injector for a vertical furnace having a process container, the process container including a process chamber therein, the injector comprising a vertical column heater including a closed column, a heater about the closed column, a reactant inlet at the bottom of the closed column, a vapor outlet at the top of the closed column;

a coupling between the vapor outlet and the bottom of the process chamber, the vapor outlet from the closed column being adjacent the bottom of the process chamber.

10. The injector of claim 9 further comprising a source of TEOS coupled with the reactant inlet.

11. The injector of claim 9 further comprising a source of DCE coupled with the reactant inlet.

12. A vertical furnace for treating a plurality of semiconductor articles, comprising a base;

a process container positionable on the base and having a process chamber therein;

a furnace heating element assembly positionable on the base and having a cavity to receive the process container;

a pedestal positioned on the base;

a semiconductor article support positioned above the pedestal within the process container with the process container positioned on the base;

an injector including an elongate tube extending into the process chamber from below and including a discharge end above the semiconductor article support, a circuitous section below the semiconductor article support and a substantially direct section between the circuitous section and the discharge end adjacent the semiconductor article support.

13. The vertical furnace of claim 12 further comprising a vertical column heater including a closed column, a heater about the closed column, a reactant inlet at the bottom of the closed column, a vapor outlet at the top of the closed column in communication with the injector.

14. The vertical furnace of claim 13 further comprising a coupling between the vapor outlet and the bottom of the injector, the vapor outlet from the closed column being adjacent the bottom of the process chamber.

15. A vertical furnace for treating a plurality of semiconductor articles, comprising a base;

a process container positionable on the base and having a process chamber therein;

a furnace heating element assembly positionable on the base and having a cavity to receive the process container;

a pedestal positioned on the base;

a semiconductor article support positioned above the pedestal in the process chamber with the process container positioned on the base;

a vertical column heater including a closed column, a heater about the closed column, a reactant inlet at the bottom of the closed column, a vapor outlet at the top of the closed column;

a coupling between the vapor outlet and the bottom of the process chamber, the vapor outlet from the closed column being adjacent the bottom of the process chamber.

\* \* \* \* \*